(12) United States Patent
Park et al.

(10) Patent No.: US 7,695,637 B2
(45) Date of Patent: Apr. 13, 2010

(54) SLURRY COMPOSITION FOR CHEMICAL MECHANICAL POLISHING AND PRECURSOR COMPOSITION THEREOF

(75) Inventors: Tae Won Park, Seongnam-si (KR); In Kyung Lee, Euiwang-si (KR); Byoung Ho Choi, Ansan-si (KR)

(73) Assignee: Cheil Industries Inc., Gum-si (KR)

( * ) Notice: Subject to any disclaimer, the term of this patent is extended or adjusted under 35 U.S.C. 154(b) by 22 days.

(21) Appl. No.: 11/615,094

(22) Filed: Dec. 22, 2006

(65) Prior Publication Data

US 2008/0121839 A1    May 29, 2008

(30) Foreign Application Priority Data

Nov. 27, 2006    (KR) .................... 10-2006-0117367

(51) Int. Cl.
   *H01L 21/302*    (2006.01)
(52) U.S. Cl. .................. 252/79.1; 510/159; 564/82
(58) Field of Classification Search ................ 252/79.1; 510/159; 564/82
   See application file for complete search history.

(56) References Cited

U.S. PATENT DOCUMENTS

2001/0005009 A1 *   6/2001   Tsuchiya et al. ............... 252/79

FOREIGN PATENT DOCUMENTS

| EP | 0342997 | * 11/1989 |
|---|---|---|
| KR | 1020000006595 | 2/2000 |
| KR | 1020000006636 | 2/2000 |

OTHER PUBLICATIONS

Gunko et al (Aqueous suspension of fumed oxides: particle size distribution and zeta potential; Advances in Colloid and Interface Science, vol. 91, Issue 1, Mar. 19, 2001, pp. 1-112).*
STN search of chemical registration No. 62621-79-8; Sep. 12, 2008; by Patricia George on Sep. 5, 2008.*
IEC search of chemical structure by Jan Deval; Jan. 29, 2008.*

* cited by examiner

*Primary Examiner*—Keith D Hendricks
*Assistant Examiner*—Patricia A George
(74) *Attorney, Agent, or Firm*—Summa, Additon & Ashe, P.A.

(57) ABSTRACT

Disclosed are a slurry composition for chemical mechanical polishing and a precursor composition thereof. The polishing slurry composition includes deionized water, abrasive particles, a pH-adjusting agent and a surfactant, wherein the surfactant includes two or more ionic moieties and two or more lipophilic groups. The polishing slurry composition can polish convex surfaces of a semiconductor having a step height at a higher rate than the polishing rate for concave surfaces acting as polishing stop layers of the semiconductor so that the polishing can be self-stopped, reduces the occurrence of surface defects after the polishing process, and has a high degree of polishing planarization and good dispersion stability.

32 Claims, No Drawings

SLURRY COMPOSITION FOR CHEMICAL MECHANICAL POLISHING AND PRECURSOR COMPOSITION THEREOF

FIELD OF THE INVENTION

The present invention relates to a polishing slurry composition useful for chemical mechanical polishing and more particularly to a polishing slurry including a surfactant with two or more ionic moieties (i.e. hydrophilic moieties) and two or more lipophilic groups.

BACKGROUND OF THE INVENTION

High integration of semiconductor devices plays a significant role in the development of electronic media that necessitate large data storage capacity and high data processing speed. The importance of miniaturization of semiconductor devices is also emphasized by the advancement of multifunctional mobile electronic media. The requirements for high integration and miniaturization make planarization processes important in achieving smaller linewidths in the manufacture of semiconductor devices.

Chemical mechanical polishing (CMP) processes have been employed to manufacture semiconductor devices having small linewidths. Generally, polishing slurries for use in CMP processes include deionized water, abrasive particles, and optionally, a polishing performance assistant or a stabilizer. Such CMP processes are based on the principle that a polishing slurry is supplied in a state where a material to be polished is placed in contact with the surface of a polishing pad such that the polishing slurry is chemically reacted with the surface of the material and at the same time the polishing pad is moved relative to the material to physically planarize irregularities of the material.

CMP processes for the formation of semiconductor interlayer dielectrics (ILDs) are carried out to polish convex surfaces of a single-layer material having a step height at a higher rate than the polishing rate for concave surfaces acting as polishing stop layers of the single-layer material, thereby planarizing the single-layer material. Generally, slurries for ILD polishing have a slight difference in polishing rate between concave surfaces and convex surfaces of semiconductors, which makes self-stopping of the polishing process difficult. In addition, generally slurries suffer from many problems in terms of surface characteristics and storage stability.

As mentioned above, as semiconductor devices become more densely integrated and smaller in size, CMP processes will be of increasing importance. However, many improvements, such as high planarity and reduction of defects, are still required to manufacture devices with ultrafine linewidths.

SUMMARY OF THE INVENTION

The present invention provides a chemical mechanical polishing slurry composition that can polish convex surfaces of a semiconductor having a step height at a higher rate than the polishing rate for concave surfaces acting as polishing stop layers of the semiconductor in a polishing process of the semiconductor requiring high planarity so that the polishing process can be self-stopped, can reduce the occurrence of surface defects after the polishing process, and can have a high degree of polishing planarization and good dispersion stability.

The present invention also provides a precursor composition of the chemical mechanical polishing slurry composition.

According to the present invention, the polishing slurry composition can include abrasive particles, a pH-adjusting agent, a surfactant and deionized water wherein the surfactant includes two or more ionic moieties and two or more lipophilic groups.

In an embodiment of the present invention, the surfactant can be present in an amount of about 0.001 to about 10% by weight, based on the total weight of the slurry composition.

In another embodiment of the present invention, the surfactant can be a compound of Formula 1 or 2 below:

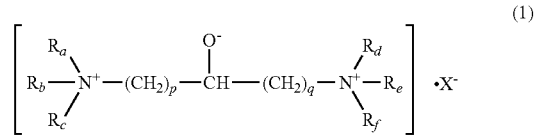

wherein $R_a$, $R_b$, $R_c$, $R_d$, $R_e$ and $R_f$ are each independently a $C_1$-$C_{20}$ alkyl group, X is a halogen, and p and q are each independently an integer from 1 to 10; or

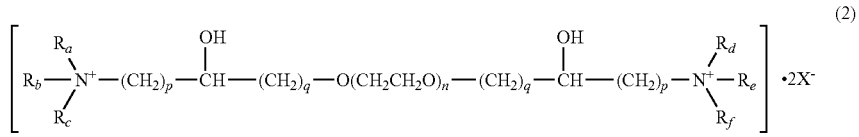

wherein $R_a$, $R_b$, $R_c$, $R_d$, $R_e$ and $R_f$ are each independently a $C_1$-$C_{20}$ alkyl group, X is a halogen, p and q are each independently an integer from 1 to 10, and n is an integer from 1 to 20.

In another embodiment of the present invention, the abrasive particles can be selected from fumed silica particles, colloidal silica particles, alumina particles, ceria particles, and mixtures thereof.

In another embodiment of the present invention, the abrasive particles can include ceria particles having an average particle diameter of about 50 to about 500 nm in an amount of about 0.25 to about 20% by weight, based on the total weight of the slurry composition.

In another embodiment of the present invention, the abrasive particles can include fumed silica particles that are monodispersed to form aggregates having an average particle diameter of about 100 to about 400 nm before use.

In another embodiment of the present invention, the pH-adjusting agent can be selected from KOH, ammonia, tetramethylammonium hydroxide (TMAH), tetraethylammonium hydroxide (TEAH), trimethylethoxyammonium hydroxide, N,N-dimethylpiperidinium hydroxide, and mixtures thereof.

In another embodiment of the present invention, the slurry composition can further include an anionic polymer.

In another embodiment of the present invention, the anionic polymer can be a polymer prepared by polymerizing a monomer having a carboxylic acid or sulfonic acid group in the molecular structure, and can have a weight average molecular weight not greater than about 10,000.

According to the present invention, there is provided a polishing slurry precursor composition including a pH-adjusting agent, a surfactant and deionized water wherein the surfactant includes two or more ionic moieties and two or more lipophilic groups.

In an embodiment of the present invention, the surfactant can be a compound of Formula 1 or 2 below:

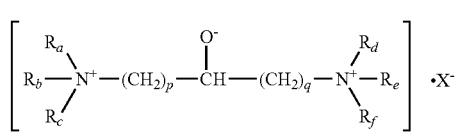

(1)

wherein $R_a$, $R_b$, $R_c$, $R_d$, $R_e$ and $R_f$ are each independently a $C_1$-$C_{20}$ alkyl group, X is a halogen, and p and q are each independently an integer from 1 to 10; or

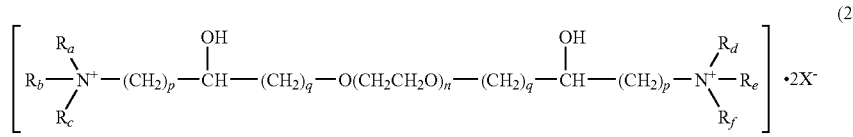

(2)

wherein $R_a$, $R_b$, $R_c$, $R_d$, $R_e$ and $R_f$ are each independently a $C_1$-$C_{20}$ alkyl group, X is a halogen, p and q are each independently an integer from 1 to 10, and n is an integer from 1 to 20.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The present invention provides a slurry composition for chemical mechanical polishing that can exhibit high planarity in a polishing process of a semiconductor requiring high planarity, can enable self-stopping of the process, and can greatly reduce the occurrence of defects after polishing. The present invention also provides a precursor composition of the slurry composition.

The polishing slurry composition of the present invention can include abrasive particles, a pH-adjusting agent, a surfactant and deionized water wherein the surfactant includes two or more ionic moieties and two or more lipophilic groups.

Exemplary abrasive particles can include without limitation fumed silica particles, colloidal silica particles, metal oxide particles, such as alumina particles or ceria particles, and mixtures thereof. Exemplary embodiments of the invention can use ceria particles having an average particle diameter of about 50 to about 500 nm in an amount of about 0.25 to about 20% by weight, based on the total weight of the slurry composition. When the abrasive particles include fumed silica particles, the fumed silica particles can be monodispersed to form aggregates having an average particle diameter ranging from about 100 to about 400 nm before use. This monodispersion of the fumed silica particles can be achieved by a method wherein a slurry containing all constituent components blended therein is accelerated under a high pressure to induce a shearing force, an impact and cavitation within an orifice (see, Korean Patent Application Nos. 1998-39212 and 1999-34608).

Because the metal oxide particles are present in a dispersed state in a liquid, one or more additives can be added to stabilize the metal oxide particles. Examples of such additives include pH-adjusting agents that are capable of achieving dispersion stability through electrostatic effects, surfactants that are added taking into consideration the interfacial characteristics of particles, and polymers that are added taking into consideration the electrical properties of particles.

The pH-adjusting agent used in the polishing slurry composition of the present invention may be an organic base. Examples of suitable organic bases include KOH, ammonia, tetramethylammonium hydroxide (TMAH), tetraethylammonium hydroxide (TEAH), trimethylethoxyammonium hydroxide, and N,N-dimethylpiperidinium hydroxide. These organic bases may be used singly or as a mixture thereof. The pH-adjusting agent can be used to adjust the pH of the final slurry composition. For the pH adjustment, the pH-adjusting agent can be used in an amount of about 0.02 to about 5% by weight, based on the total weight of the slurry composition.

When the abrasive particles are ceria particles with an inherent ionicity that is a positive value, an anionic polymer can be used, taking into consideration the electrical properties of the particles. The anionic polymer can be prepared by polymerizing a monomer having a carboxylic acid or sulfonic acid group in the molecular structure and can have an average molecular weight not greater than about 10,000. The anionic polymer can be present in an amount of about 0.02 to about 5% by weight, based on the total weight of the slurry composition. Exemplary anionic polymers useful in the present invention can include without limitation polyacrylic acid, polysulfonic acid, polyacrylic acid/maleic acid copolymers, polyacrylic acid/amide copolymers, and mixtures thereof.

The slurry composition of the present invention can further include a surfactant including two or more ionic moieties and two or more lipophilic groups. General surfactants have a structure composed of one ionic moiety and one lipophilic group and exhibit their inherent interfacial characteristics at different interfaces. In contrast to general surfactants, the surfactant with two or more ionic moieties and two or more lipophilic groups used in the slurry composition of the present invention has a relatively low critical micelle concentration (CMC) and has an orientation number (n) within a relatively narrow range. Thus the surfactants useful in the present invention can exhibit an improvement in interfacial characteristics, such as emulsification, dispersion and adsorption. This surfactant is called a 'gemini surfactant'. The present inventors introduced a gemini surfactant in a polishing slurry composition and a precursor composition thereof to enhance the planarity of a layer material to be polished and minimize the occurrence of surface defects. The gemini surfactant can be represented by Formula 1 or 2 below:

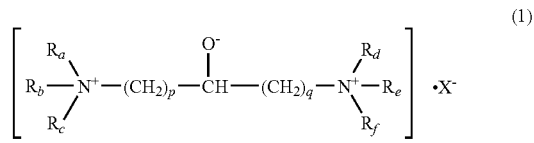

(1)

wherein $R_a$, $R_b$, $R_c$, $R_d$, $R_e$ and $R_f$ are each independently a $C_1$-$C_{20}$ alkyl group, X is a halogen, and p and q are each independently an integer from 1 to 10; or

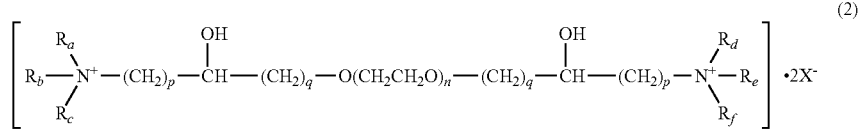

(2)

wherein $R_a$, $R_b$, $R_c$, $R_d$, $R_e$ and $R_f$ are each independently a $C_1$-$C_{20}$ alkyl group, X is a halogen, p and q are each independently an integer from 1 to 10, and n is an integer from 1 to 20.

In Formula 1, each $R_a$, $R_b$, $R_c$, $R_d$, $R_e$ and $R_f$ can be an alkyl group having 1 to 12 carbon atoms, for example an alkyl group having 1 to 4 carbon atoms; each p and q can be an integer from 1 to 3, for example 1; and X can be Cl.

In Formula 2, each $R_a$, $R_b$, $R_c$, $R_d$, $R_e$ and $R_f$ can be an alkyl group having 1 to 4 carbon atoms; n can be an integer from 1 to 8, for example an integer from 1 to 4; each p and q can be an integer from 1 to 3, for example 1; and X can be Cl.

The roles of the gemini surfactant used in the present invention can be as follows.

Firstly, the gemini surfactant can act to control the ratio of the polishing rate for parts (convex surfaces) protruded from the surface of a semiconductor having a step height and the polishing rate for parts (concave surfaces) recessed from the surface of the semiconductor, thereby achieving high planarity of the semiconductor. This control is based on a surface adsorption phenomenon of the gemini surfactant. General polishing slurries have a disadvantage in that there is no substantial difference in polishing rate between convex and concave surfaces of semiconductors. In contrast, when the polishing slurry composition comprising the gemini surfactant according to the present invention is used to polish a semiconductor, it polishes only parts protruded from the surface of the semiconductor at the initial stage of polishing, and thereafter, polishing is continued until the height of convex surfaces of the semiconductor reaches that of concave surfaces of the semiconductor. As a result, the slurry composition of the present invention enables self-stopping of the polishing process, which is thought to be because the hydrophilic moieties of the gemini surfactant are attached to the surface of a semiconductor. Since this phenomenon is not found in general polishing slurries, concave surfaces and convex surfaces of semiconductors are simultaneously polished to some degree. The use of the gemini surfactant in the polishing slurry of the present invention enables control of the relative polishing rate for convex surfaces and concave surfaces of a semiconductor.

The amount of gemini surfactant may be slightly varied according to the kind of layer materials to be polished. In most oxide layer materials, the gemini surfactant can be used in an amount of about 0.001 to about 10% by weight, for example about 0.001 to about 5% by weight, based on the total weight of the slurry composition.

Secondly, since the gemini surfactant has a lower critical micelle concentration and more readily disperses particles than general surfactants, it can markedly stabilize the behavior of abrasive particles. In addition, since the gemini surfactant provides excellent cleaning characteristics after polishing, it can improve the storage stability of the slurry composition and can reduce the occurrence of surface defects after polishing.

On the other hand, in the case where ceria particles are used as the abrasive particles, the following two solutions are separately prepared, i.e. i) a solution of the metal oxide abrasive particles and a small amount of a dispersant in deionized water and ii) a solution of the precursor composition comprising the pH-adjusting agent, a dispersant and the surfactant in deionized water. Thereafter, the two solutions are mixed together just before polishing of a semiconductor. This binary solution system can maximize the dispersion stability of the slurry composition.

Hereinafter, the present invention will be explained in more detail with reference to the following examples. However, these examples are given for the purpose of illustration and are not to be construed as limiting the scope of the invention.

EXAMPLES

Comparative Example 1

(1) Preparation of Silica-Containing Slurry Composition for ILD 875 g of fumed silica is sufficiently dispersed in 6,508 g of deionized water. Thereafter, 35 g of KOH is added to the dispersion with stirring at 500 rpm in a stirring vessel. Twenty minutes after the addition, 28 g of TMAH is added to the stirring vessel with stirring to obtain a slurry. The slurry is passed through a 3-μm filter to prepare a polishing slurry composition. Polishing is performed using the polishing slurry composition.

(2) Evaluation of Polishing Performance

An 8" silicon wafer, on which a silicon oxide film is formed by TEOS-plasma chemical vapor deposition (CVD), is mounted on a polishing head, to which a membrane for the attachment of a substrate is adhered, disposed on a platen such that the silicon oxide film is directed downward. The platen is composed of a polishing pad and a polishing table to which the polishing pad is attached. Polishing is conducted under the following conditions.

First, the slurry composition is rotated at a rate of 200 ml/min. for one minute on the platen to polish the silicon oxide. After completion of the polishing, the wafer is detached from the polishing head, and cleaned sequentially with deionized water, dilute hydrofluoric acid (HF) and dilute ammonia water. Drops of water are removed from the cleaned wafer by spin drying. A variation in the thickness of the layer before and after the polishing is measured using a blanket thickness tester, the polishing rate is calculated, and occurrence of surface defects on the surface of the insulating film is thoroughly observed.

A pattern for an ILD having a step height between convex and concave surfaces of 3,000 Å is polished. The layer thicknesses of the concave surfaces and the convex surfaces are measured using a pattern thickness tester. From the thickness values, the polishing rate and degree of planarization are calculated.

The dispersion stability or storage stability of the polishing slurry is evaluated by the following procedure. First, a solution of the abrasive particles is mixed with the other components of the precursor composition. The mixture is allowed to stand at room temperature for 3 days. The height of the slurry particles settled in the mixture is measured, and the ratio of the height of the settled slurry particles to the entire height of the slurry particles is calculated.

Polisher and Testers
Polisher: Mirra (AMAT)
Polishing pad: IC1010/Suba IV Stacked (Rodel)
Wafer: PE-TEOS 8" blanket wafer (15,000 Å)
Patterned wafer for ILD (step height: 3,000 Å)
Blanket thickness tester: N&K-1500 (N&K)
Defect measuring system: Surfscan-6420 (KLA-Tencor)
Pattern thickness tester: Opti-Probe 2600 (Therma Wave)
Polishing Conditions
Rotational speed of spindle: 87 rpm
Rotational speed of platen: 93 rpm
Pressure of wafer: 4.0 psi
Pressure of retainer ring: 5.0 psi
Pressure of conditioner ring: 6.0 psi
Pressure of direct line: 4.0 psi
Flow rat of slurry composition: 200 ml/min.
Temperature: 25° C.

Comparative Example 2

(1) Preparation of Ceria-Containing Slurry Composition 5 wt % of ceria particles as metal oxide particles having an average particle diameter of 300 nm are dispersed in deionized water to obtain a solution of the abrasive particles. Separately, a solution (2.0 wt %) of 30 wt % of a polyacrylic acid/maleic acid copolymer (average molecular weight: 3,000) in deionized water and a solution (3.0 wt %) of 20 wt % of TMAH as a pH-adjusting agent in deionized water are added to deionized water to obtain a dilute precursor composition. The solution of the abrasive particles, the precursor composition and deionized water are mixed in a ratio of 1:6:3 to prepare a slurry composition. Polishing is conducted using the slurry composition.

(2) Evaluation of Polishing Performance

The polishing performance of the slurry composition is evaluated in the same manner as described in Comparative Example 1.

Comparative Example 3

A slurry composition is prepared in the same manner as in Comparative Example 2, except that octyldimethylammonium as a cationic surfactant, which includes one ionic moiety and one lipophilic group, is added in an amount of 0.75 wt %, based on the total weight of the slurry composition. After polishing is conducted using the slurry composition, the polishing performance of the slurry composition is evaluated in the same manner as described in Comparative Example 1.

Comparative Example 4

A slurry composition is prepared in the same manner as in Comparative Example 2, except that polyoxyethylene octyl ether, to which 7 moles of ethylene oxide is added, as a surfactant is added in an amount of 0.75% by weight, based on the total weight of the slurry composition. After polishing is conducted using the slurry composition, the polishing performance of the slurry composition is evaluated in the same manner as described in Comparative Example 1.

Examples 1 to 6

Slurry compositions are prepared in the same manner as in Comparative Example 2, except that each of the gemini surfactants of Formula 3 shown in Table 1 as a surfactant is added in an amount of 0.75% by weight, based on the total weight of the corresponding slurry composition. After polishing is conducted using the slurry compositions, the polishing performance of the slurry compositions is evaluated in the same manner as described in Comparative Example 1.

Example 7

A slurry composition is prepared in the same manner as in Comparative Example 1, except that the gemini surfactant of Formula 3 shown in Table 1 as a surfactant is added in an amount of 0.75% by weight, based on the total weight of the slurry composition. After polishing is conducted using the slurry composition, the polishing performance of the slurry composition is evaluated in the same manner as described in Comparative Example 1.

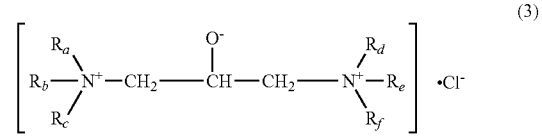

TABLE 1

| Example No. | Polishing Particles | Surfactant Formula 3 $R_a, R_c, R_d, R_f$ | $R_b, R_e$ | Other | *1 (Å/min.) | *2 (Å/min.) | *3 (number) | *4 | *5 (%) |
|---|---|---|---|---|---|---|---|---|---|
| Comparative Example 1 | Fumed Silica | — | — | — | 2600 | 1320 | 23 | 23 | 2 |
| Comparative Example 2 | Ceria | — | — | — | 1643 | 430 | 83 | 32 | 36 |
| Comparative Example 3 | Ceria | — | — | Octyldimethyl ammonium | 643 | 84 | 45 | 28 | 24 |
| Comparative Example 4 | Ceria | — | — | Polyoxyethylene octyl ether | 323 | 125 | 98 | 42 | 26 |
| Example 1 | Ceria | Methyl | Methyl | | 2432 | 160 | 21 | 6 | 4 |
| Example 2 | Ceria | Ethyl | Ethyl | | 2136 | 143 | 15 | 7 | 6 |
| Example 3 | Ceria | Methyl | n-Butyl | | 2523 | 172 | 20 | 5 | 5 |
| Example 4 | Ceria | Methyl | n-Hexyl | | 1827 | 103 | 16 | 10 | 10 |
| Example 5 | Ceria | Methyl | n-Octyl | | 1136 | 56 | 22 | 13 | 18 |
| Example 6 | Ceria | Methyl | n-Lauryl | | 837 | 23 | 18 | 15 | 23 |
| Example 7 | Fumed Silica | Methyl | Methyl | | 2827 | 520 | 13 | 8 | 1 |

NOTE
*1 Polishing rate for convex surfaces of the patterned wafer
*2 Polishing rate for concave surfaces of the patterned wafer
*3 Defects: The number of defects formed on the surface of the wafer after polishing of the blanket wafer, as measured using Surfscan-6420
*4 Degree of planarization: Uniformity of polishing rate for convex surfaces of the patterned wafer over the entire surface of the wafer
*5 Settlement ratio: Ratio of the height of the settled particles to the entire height of the slurry particles, which is calculated after the solution of the abrasive particles is mixed with the precursor composition and the mixture is alowed to stand for 3 days.

As can be seen from the results of Table 1, although there is a slight difference according to the kind of the abrasive particles, the slurry compositions prepared in Examples 1 to 7, which include a gemini surfactant, show a relatively large difference in polishing rate between convex and concave surfaces, as compared to the slurry compositions prepared in Comparative Examples 1 and 2, which do not include a surfactant, and the slurry compositions prepared in Comparative Examples 3 and 4, which include a general surfactant. In addition, the slurry compositions including a gemini surfactant show less surface defects, high degree of planarization and good dispersion stability after polishing.

The slurry compositions prepared in Examples 4 to 6 show deterioration of polishing performance and other physical properties with increasing number of carbon atoms of the alkyl groups, which are lipophilic groups of the gemini surfactants. This is believed to result from decreasing adsorptivity of the hydrophilic groups with increasing size of the alkyl groups acting as lipophilic groups.

Example 8

A slurry composition is prepared in the same manner as in Comparative Example 2, except that the gemini surfactant of Formula 4 (n=1) shown in Table 2 as a surfactant is added in an amount of 0.75% by weight, based on the total weight of the slurry composition. After polishing is conducted using the slurry composition, the polishing performance of the slurry composition is evaluated in the same manner as described in Comparative Example 1.

Example 9

A slurry composition is prepared in the same manner as in Comparative Example 2, except that the gemini surfactant of Formula 4 (n=2) shown in Table 2 as a surfactant is added in an amount of 0.75% by weight, based on the total weight of the slurry composition. After polishing is conducted using the slurry composition, the polishing performance of the slurry composition is evaluated in the same manner as described in Comparative Example 1.

Example 10

A slurry composition is prepared in the same manner as in Comparative Example 2, except that the gemini surfactant of Formula 4 (n=4) shown in Table 2 as a surfactant is added in an amount of 0.75% by weight, based on the total weight of the slurry composition. After polishing is conducted using the slurry composition, the polishing performance of the slurry composition is evaluated in the same manner as described in Comparative Example 1.

Example 11

A slurry composition is prepared in the same manner as in Comparative Example 1, except that the gemini surfactant of Formula 4 (n=1) shown in Table 2 as a surfactant is added in an amount of 0.75% by weight, based on the total weight of the slurry composition. After polishing is conducted using the slurry composition, the polishing performance of the slurry composition is evaluated in the same manner as described in Comparative Example 1.

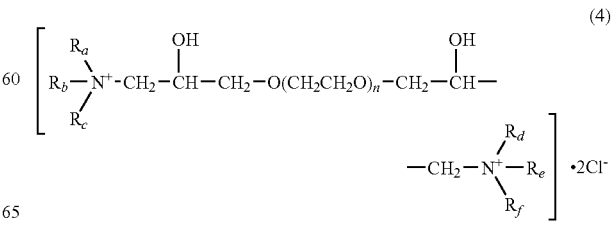

(4)

TABLE 2

| Example No. | Polishing particles | Surfactant Formula 4 $R_a, R_c, R_d, R_f$ | $R_b, R_e$ | Other | *1 (Å/min.) | *2 (Å/min.) | *3 (number) | *4 | *5 (%) |
|---|---|---|---|---|---|---|---|---|---|
| Comparative Example 1 | Fumed silica | — | — | — | 2600 | 1320 | 23 | 23 | 2 |
| Comparative Example 2 | Ceria | — | — | — | 1643 | 430 | 83 | 32 | 36 |
| Comparative Example 3 | Ceria | — | — | Octyldimethyl ammonium | 643 | 84 | 45 | 28 | 24 |
| Comparative Example 4 | Ceria | — | — | Polyoxyethylene octyl ether | 323 | 125 | 98 | 42 | 26 |
| Example 8 | Ceria | Methyl | Methyl | — | 2120 | 104 | 24 | 4 | 5 |
| Example 9 | Ceria | Ethyl | Ethyl | — | 1743 | 86 | 22 | 6 | 8 |
| Example 10 | Ceria | Methyl | n-Butyl | — | 2236 | 112 | 23 | 4 | 7 |
| Example 11 | Fumed silica | Methyl | Methyl | — | 2675 | 320 | 18 | 8 | 2 |

NOTE
*1 Polishing rate for convex surfaces
*2 Polishing rate for concave surfaces
*3 Defects
*4 Degree of planarization
*5 Settlement ratio As can be seen from the results of Table 2, although there is a slight difference according to the kind of the abrasive particles, the slurry compositions prepared in Examples 8 to 11, which include a gemini surfactant, show a relatively large difference in polishing rate between convex and concave surfaces, as compared to the slurry compositions prepared in Comparative Examples 1 and 2, which do not include a surfactant, and the slurry compositions prepared in Comparative Examples 3 and 4, which include a general surfactant. In addition, the slurry compositions including a gemini surfactant show less surface defects, high degree of planarization and good dispersion stability after polishing.

As apparent from the foregoing, the present invention provides a slurry composition and a precursor composition thereof including a gemini surfactant. Because the slurry composition of the present invention can polish convex surfaces of a semiconductor having a step height at a higher rate than the polishing rate for concave surfaces acting as polishing stop layers of the semiconductor in a polishing process of the semiconductor requiring high planarity, the invention can provide a polishing process that can be self-stopped, can reduce the occurrence of surface defects after the polishing process, and can have a high degree of polishing planarization and good dispersion stability.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A polishing slurry composition comprising abrasive particles, a pH-adjusting agent, a surfactant and deionized water wherein the surfactant includes two or more ionic moieties and two or more lipophilic groups and wherein the surfactant is a compound of Formula 1 below:

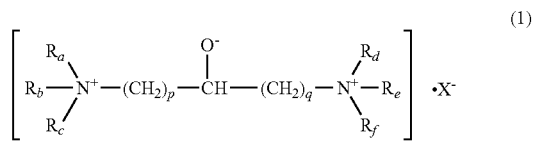

wherein $R_a$, $R_b$, $R_c$, $R_d$, $R_e$ and $R_f$ are each independently a $C_1$-$C_{20}$ alkyl group, X is a halogen, and p and q are each independently an integer from 1 to 10.

2. The polishing slurry composition according to claim 1, wherein the surfactant is present in an amount of about 0.001 to about 10% by weight, based on the total weight of the slurry composition.

3. The polishing slurry composition according to claim 1, wherein each $R_a$, $R_b$, $R_c$, $R_d$, $R_e$ and $R_f$ of Formula 1 is an alkyl group having 1 to 12 carbon atoms.

4. The polishing slurry composition according to claim 1, wherein each p and q of Formula 1 is an integer from 1 to 3.

5. The polishing slurry composition according to claim 1, wherein X of Formula 1 is Cl.

6. The polishing slurry composition according to claim 1, wherein the abrasive particles comprise particles selected from fumed silica particles, colloidal silica particles, alumina particles, ceria particles, and mixtures thereof.

7. The polishing slurry composition according to claim 6, wherein the abrasive particles comprise ceria particles having an average particle diameter of about 50 to about 500 nm in an amount of about 0.25 to about 20% by weight, based on the total weight of the slurry composition.

8. The polishing slurry composition according to claim 6, wherein the abrasive particles comprise fumed silica particles monodispersed to form aggregates having an average particle diameter of about 100 to about 400 nm before use.

9. The polishing slurry composition according to claim 1, wherein the pH-adjusting agent comprises a pH-adjusting agent selected from KOH, ammonia, tetramethylammonium hydroxide (TMAH), tetraethylammonium hydroxide (TEAH), trimethylethoxyammonium hydroxide, N,N-dimethylpiperidinium hydroxide, and mixtures thereof.

10. The polishing slurry composition according to claim 1, comprising the pH-adjusting agent an amount of about 0.02 to about 5% by weight, based on the total weight of the slurry composition.

11. The polishing slurry composition according to claim 1, wherein the slurry composition has a final pH of about 3 to about 12.

12. The polishing slurry composition according to claim 1, further comprising an anionic polymer.

13. The polishing slurry composition according to claim 12, wherein the anionic polymer is present in an amount of about 0.02 to about 5% by weight, based on the total weight of the slurry composition.

14. The polishing slurry composition according to claim 12, wherein the anionic polymer comprises a polymer prepared by polymerizing a monomer having a carboxylic acid or sulfonic acid group in the molecular structure, and has an average molecular weight not greater than about 10,000.

15. The polishing slurry composition according to claim 12, wherein the anionic polymer comprises a polymer selected polyacrylic acid, polysulfonic acid, polyacrylic acid/maleic acid copolymers, polyacrylic acid/amide copolymers, and mixtures thereof.

16. A polishing slurry precursor composition comprising a pH-adjusting agent, a surfactant and deionized water wherein the surfactant includes two or more ionic moieties and two or more lipophilic groups and wherein the surfactant is a compound of Formula 1 below:

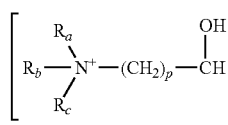

wherein $R_a$, $R_b$, $R_c$, $R_d$, $R_e$ and $R_f$ are each independently a $C_1$-$C_{20}$ alkyl group, X is a halogen, and p and q are each independently an integer from 1 to 10.

17. A polishing slurry precursor composition comprising a pH-adjusting agent, a surfactant and deionized water wherein the surfactant includes two or more ionic moieties and two or more lipophilic groups and wherein the surfactant is a compound of Formula 2 below:

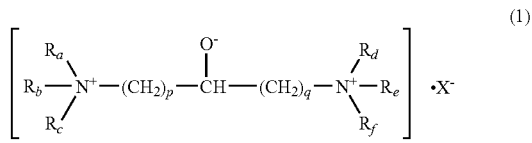

wherein $R_a$, $R_b$, $R_c$, $R_d$, $R_e$ and $R_f$ are each independently a $C_1$-$C_{20}$ alkyl group, X is a halogen, p and q are each independently an integer from 1 to 10, and n is an integer from 1 to 20.

18. A polishing slurry composition comprising abrasive particles, a pH-adjusting agent, a surfactant and deionized water wherein the surfactant includes two or more ionic moieties and two or more lipophilic groups and wherein the surfactant is a compound of Formula 2 below:

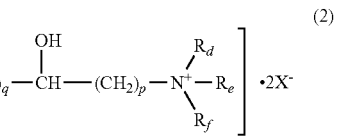

wherein $R_a$, $R_b$, $R_c$, $R_d$, $R_e$ and $R_f$ are each independently a $C_1$-$C_{20}$ alkyl group, X is a halogen, p and q are each independently an integer from 1 to 10, and n is an integer from 1 to 20.

19. The polishing slurry composition according to claim 18, wherein each $R_a$, $R_b$, $R_c$, $R_d$, $R_e$ and $R_f$ of Formula 2 is an alkyl group having 1 to 4 carbon atoms.

20. The polishing slurry composition according to claim 18, wherein n of Formula 2 is an integer from 1 to 8.

21. The polishing slurry composition according to claim 18, wherein X of Formula 2 is Cl.

22. The polishing slurry composition according to claim 18, wherein the surfactant is present in an amount of about 0.001 to about 10% by weight, based on the total weight of the slurry composition.

23. The polishing slurry composition according to claim 18, wherein the abrasive particles comprise particles selected from fumed silica particles, colloidal silica particles, alumina particles, ceria particles, and mixtures thereof.

24. The polishing slurry composition according to claim 23, wherein the abrasive particles comprise ceria particles having an average particle diameter of about 50 to about 500 nm in an amount of about 0.25 to about 20% by weight, based on the total weight of the slurry composition.

25. The polishing slurry composition according to claim 23, wherein the abrasive particles comprise fumed silica particles monodispersed to form aggregates having an average particle diameter of about 100 to about 400 nm before use.

26. The polishing slurry composition according to claim 18, wherein the pH-adjusting agent comprises a pH-adjusting agent selected from KOH, ammonia, tetramethylammonium hydroxide (TMAH), tetraethylammonium hydroxide (TEAH), trimethylethoxyammonium hydroxide, N,N-dimethylpiperidinium hydroxide, and mixtures thereof.

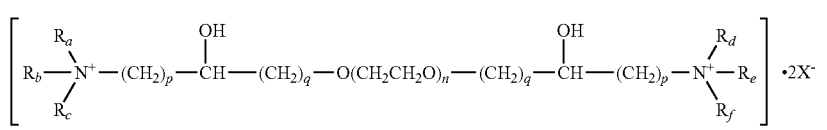

27. The polishing slurry composition according to claim 18, comprising the pH-adjusting agent an amount of about 0.02 to about 5% by weight, based on the total weight of the slurry composition.

28. The polishing slurry composition according to claim 18, wherein the slurry composition has a final pH of about 3 to about 12.

29. The polishing slurry composition according to claim 18, further comprising an anionic polymer.

30. The polishing slurry composition according to claim 29, wherein the anionic polymer is present in an amount of about 0.02 to about 5% by weight, based on the total weight of the slurry composition.

31. The polishing slurry composition according to claim 29, wherein the anionic polymer comprises a polymer prepared by polymerizing a monomer having a carboxylic acid or sulfonic acid group in the molecular structure, and has an average molecular weight not greater than about 10,000.

32. The polishing slurry composition according to claim 29, wherein the anionic polymer comprises a polymer selected polyacrylic acid, polysulfonic acid, polyacrylic acid/maleic acid copolymers, polyacrylic acid/amide copolymers, and mixtures thereof.

* * * * *